United States Patent
Diekmann et al.

(10) Patent No.: US 9,651,203 B2
(45) Date of Patent: May 16, 2017

(54) LIGHT PANEL SYSTEM

(71) Applicant: OSRAM OLED GmbH, Regensburg (DE)

(72) Inventors: Karsten Diekmann, Rattenberg (DE); Christoph Gärditz, München (DE); Christian Kristukat, Buenos Aires (AR); Stefan Gschlößl, Nittendorf (DE); Benjamin Claus Krummacher, Regensburg (DE); Jörg Farrnbacher, Regensburg (DE); Kilian Regau, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/650,551

(22) PCT Filed: Nov. 29, 2013

(86) PCT No.: PCT/EP2013/075115
§ 371 (c)(1),
(2) Date: Jun. 8, 2015

(87) PCT Pub. No.: WO2014/090602
PCT Pub. Date: Jun. 19, 2014

(65) Prior Publication Data
US 2015/0338029 A1  Nov. 26, 2015

(30) Foreign Application Priority Data
Dec. 14, 2012 (DE) .................. 10 2012 223 162

(51) Int. Cl.
*H01L 51/50* (2006.01)
*F21K 99/00* (2016.01)
(Continued)

(52) U.S. Cl.
CPC ............... *F21K 9/30* (2013.01); *F21K 9/20* (2016.08); *F21S 8/00* (2013.01); *F21V 19/002* (2013.01);
(Continued)

(58) Field of Classification Search
CPC ..... H01L 2924/0002; H01L 2251/5361; H01L 2924/00; H01L 51/50; F21Y 2105/00;
(Continued)

(56) References Cited

U.S. PATENT DOCUMENTS 6,949,879 B1 * 9/2005 Wright ............... H01L 27/3244
313/504
8,870,410 B2  10/2014 Auyeung
(Continued)

FOREIGN PATENT DOCUMENTS

CN  1483960 A  3/2004
CN  1620213 A  5/2005
(Continued)

OTHER PUBLICATIONS

"GE Stops R&D in Incandescent Technology to Focus on OLEDs," Dec. 2, 2008, 1 page, http://www.sustainabilityninja.com/sustainable-technology-gadgets/ge-stops-rd-in-incandescent-technology-to-focus-on-oleds-69585/.
(Continued)

*Primary Examiner* — Andrew Coughlin
*Assistant Examiner* — Fatima Farokhrooz
(74) *Attorney, Agent, or Firm* — Slater Matsil, LLP

(57) ABSTRACT

In at least one embodiment, a light panel system includes a system carrier with a carrier front face. Multiple organic light emitting diodes are arranged in a uniform grid on the carrier front face. An electronics driver is fitted to or in the system carrier. The light panel system can be handled and mounted as a single unit.

15 Claims, 7 Drawing Sheets

(51) Int. Cl.
*F21V 23/00* (2015.01)
*F21V 23/06* (2006.01)
*F21V 19/00* (2006.01)
*F21V 29/70* (2015.01)
*F21S 8/00* (2006.01)
*F21K 9/20* (2016.01)
*F21Y 105/00* (2016.01)
*F21Y 105/10* (2016.01)
*F21Y 115/10* (2016.01)
*F21Y 115/15* (2016.01)

(52) U.S. Cl.
CPC ............ *F21V 23/005* (2013.01); *F21V 23/06* (2013.01); *F21V 29/70* (2015.01); *F21Y 2105/00* (2013.01); *F21Y 2105/10* (2016.08); *F21Y 2115/10* (2016.08); *F21Y 2115/15* (2016.08); *H01L 2251/5361* (2013.01); *H01L 2924/0002* (2013.01)

(58) Field of Classification Search
CPC .............. F21Y 2105/10; F21Y 2115/10; F21Y 2115/15; F21Y 2105/001; F21S 8/00; F21V 29/70; F21V 19/002; F21V 23/005; F21V 23/06; F21K 9/20; F21K 9/30
See application file for complete search history.

(56) References Cited

U.S. PATENT DOCUMENTS

| | | | |
|---|---|---|---|
| 2004/0032220 A1* | 2/2004 | Cok | H01L 27/3204 315/291 |
| 2004/0061107 A1* | 4/2004 | Duggal | H01L 27/3211 257/40 |
| 2005/0141242 A1 | 6/2005 | Takeuchi | |
| 2006/0125410 A1* | 6/2006 | Duggal | G09F 9/33 315/169.3 |
| 2007/0077349 A1* | 4/2007 | Newman | B82Y 20/00 427/66 |
| 2007/0133189 A1* | 6/2007 | Isobe | H01L 51/5281 362/19 |
| 2009/0267493 A1* | 10/2009 | Suh | G09F 9/33 313/504 |
| 2010/0207846 A1* | 8/2010 | Na | G02F 1/13624 345/55 |
| 2010/0213836 A1* | 8/2010 | Liao | G09F 9/33 313/513 |
| 2011/0157893 A1 | 6/2011 | Ngai et al. | |
| 2011/0285273 A1 | 11/2011 | Albrecht et al. | |
| 2012/0268523 A1* | 10/2012 | Fukada | B41J 2/14274 347/40 |
| 2012/0294016 A1 | 11/2012 | Tran et al. | |
| 2013/0099658 A1* | 4/2013 | Tsai | H01L 51/0097 313/504 |
| 2013/0170238 A1 | 7/2013 | Diekmann et al. | |
| 2013/0278144 A1* | 10/2013 | Levermore | H01L 51/5203 315/121 |
| 2014/0078752 A1 | 3/2014 | Gaerditz et al. | |
| 2014/0140041 A1 | 5/2014 | Spintge et al. | |
| 2014/0203253 A1 | 7/2014 | Goeoetz et al. | |
| 2014/0367666 A1 | 12/2014 | Schicktanz | |
| 2015/0049444 A1* | 2/2015 | Venk | H05K 1/028 361/749 |
| 2015/0091435 A1 | 4/2015 | Schicktanz et al. | |
| 2015/0115237 A1 | 4/2015 | Diekmann et al. | |

FOREIGN PATENT DOCUMENTS

| | | |
|---|---|---|
| CN | 101288172 A | 10/2008 |
| DE | 102006060781 A1 | 4/2008 |
| DE | 102010008359 A1 | 8/2011 |
| DE | 102010008788 A1 | 8/2011 |
| DE | 102010039956 A1 | 3/2012 |
| DE | 102010038252 A1 | 4/2012 |
| DE | 102010042132 A1 | 4/2012 |
| DE | 102010042727 A1 | 5/2012 |
| DE | 102011077687 A1 | 12/2012 |
| DE | 202012104303 U1 | 1/2013 |
| DE | 102011056570 A1 | 6/2013 |
| DE | 102012200023 A1 | 7/2013 |
| DE | 102012201801 A1 | 8/2013 |
| EP | 1533633 A1 | 5/2005 |
| WO | 2007041116 A1 | 4/2007 |
| WO | 2012107247 A1 | 8/2012 |

OTHER PUBLICATIONS

"Ledon OLED Lighting stellt das weltweit leistungsfahigste OLED Lightmodul mit 1001 Lumen und neue Produktilinien auf dem OLED Lighting Design Summit in London vor (LEDON OLED Lighting presents the world's most powerful OLED light module with 1001 lumens and new product lines at the OLED Lighting Design Summit in London)," OLED Lighting Design Summit Europe 2011, Jun. 17, 2011, 3 pages.

"Orbeos SDW-058—Information Sheet," OSRAM OLED, Datasheet, Aug. 2014, 1 page.

Tridonic, "OLED-Leuchten (OLED luminaires)," Brochure, V01, Apr. 2012, 2 pages.

Winona Lighting, "OLED Lighting," Brochure, WL_1060, Mar. 2015, 20 pages.

\* cited by examiner

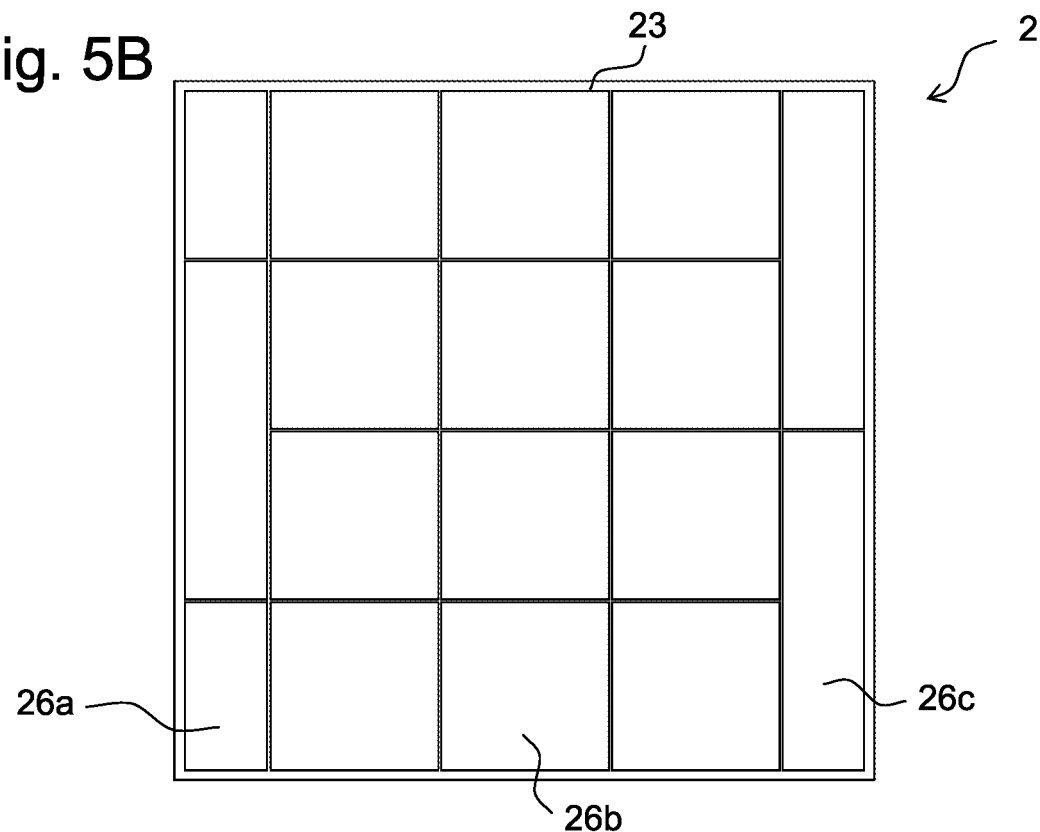
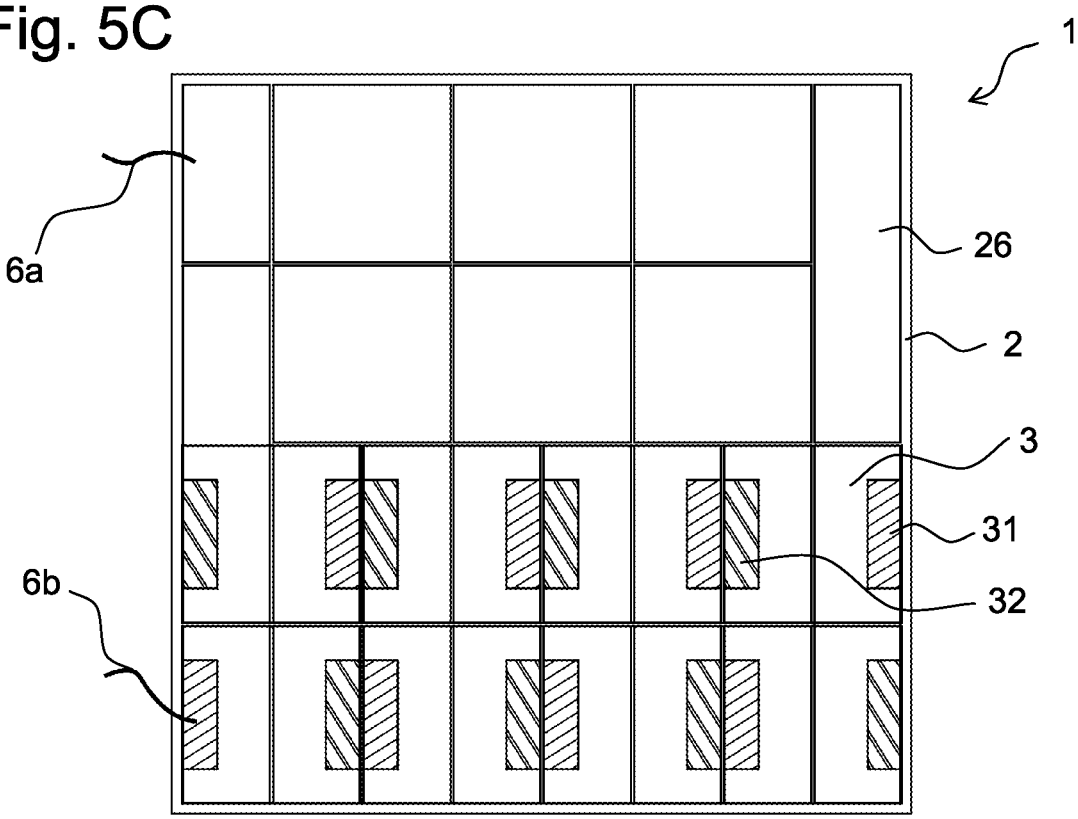

LIGHT PANEL SYSTEM

This patent application is a national phase filing under section 371 of PCT/EP2013/075115, filed Nov. 29, 2013, which claims the priority of German patent application 10 2012 223 162.5, filed Dec. 14, 2012, each of which is incorporated herein by reference in its entirety.

TECHNICAL FIELD

A light panel system is provided.

SUMMARY

Embodiments of the invention provide a light panel system that can be mounted with little effort.

According to at least one embodiment, the light panel system comprises a system carrier. The system carrier comprises a carrier front and a back opposite thereto. The system carrier is preferably the component mechanically bearing and mechanically supporting the light panel system. It is possible for the system carrier to make the light panel system mechanically self-supporting and mechanically stable and for no further mechanically supporting components to be needed. For example, the light panel system does not bend or does not do so significantly due to the system carrier if used properly. Alternatively, the system carrier may also be of mechanically flexible construction, for instance in the form of film.

According to at least one embodiment, the light panel system comprises a plurality of organic light-emitting diodes. The organic light-emitting diodes in particular each contain at least one organic active layer intended for generating radiation, wherein this active layer is preferably encapsulated. Carrier plates with the at least one organic active layer located between them in particular serve to encapsulate the organic light-emitting diodes. The two carrier plates are joined together for instance by an encapsulating composition. The organic light-emitting diodes may be components which are individually electrically drivable, may be handled separately prior to mounting and are fastened to the system carrier.

The active layer is in particular a contiguous region, in which charge carrier recombination takes place. The active layer may comprise a plurality of sub-regions arranged one above the other, which are configured to generate radiation of different wavelengths and in which in each case charge carrier recombination takes place. If the light-emitting diode comprises a plurality of active layers, an electrode or a charge carrier generation layer (CGL for short), for example, is located between adjacent active layers, in a stacking direction.

According to at least one embodiment, the organic light-emitting diodes are arranged in a regular grid on the carrier front. The light-emitting diodes are preferably arranged in columns and rows in the manner of a matrix.

According to at least one embodiment, the light panel system includes at least one drive electronics unit. The drive electronics unit is designed to supply the organic light-emitting diodes with a suitable electrical voltage and with a suitable electrical current and/or to drive the organic light-emitting diodes in a purposeful manner.

For example, the drive electronics unit is a ballast, which converts a 230 V line voltage or a 110 V line voltage into a direct voltage adapted to the organic light-emitting diodes.

According to at least one embodiment, the drive electronics unit is mounted on or in the system carrier. For example, the drive electronics unit is fastened to the back of the system carrier. Likewise, the drive electronics unit may be a component integrated into the system carrier for instance using injection molding. Such components are also known as Molded Interconnect Devices, or MID for short.

According to at least one embodiment, the light panel system may be handled and mounted as a single unit. In other words, the light panel system does not then have to be assembled from a plurality of different components on mounting. The light panel system can be fastened mechanically as a whole and connected electrically as a whole.

In at least one embodiment, the light panel system comprises a system carrier with a carrier front. A plurality of organic light-emitting diodes are arranged in a regular grid on the carrier front. A drive electronics unit is mounted on or in the system carrier. The light panel system may be handled and mounted as a single unit.

Organic light-emitting diodes are generally of flat construction and have a comparatively low luminance per unit area, relative, for example, to inorganic light sources such as incandescent lamps or semiconductor light-emitting diodes. To achieve sufficient illuminance using organic light-emitting diodes, relatively large areas need to be provided with organic light-emitting diodes.

However, in the case of conventional light-emitting diodes, which take the form, for example, of "light tiles", this is associated with a relatively large amount of effort when mounting the individual light-emitting diodes. With the stated light panel system, even large-area lighting devices with organic light-emitting diodes may be efficiently handled and, in particular for the purposes of general lighting, simply mounted. The light panel system comprises in particular a "Plug and Play" system, which may for instance be incorporated into existing building architectures and is preferably interchangeable as a whole.

According to at least one embodiment, the light panel system comprises one or more covering layers. The at least one covering layer preferably extends contiguously on a side remote from the system carrier over at least some of the light-emitting diodes or over all the light-emitting diodes. It is possible for the organic light-emitting diodes to be mechanically integrated via the covering layer, in addition to the system carrier. In particular, two components of the light panel system are formed by the system carrier and by the covering layer, all the light-emitting diodes being located therebetween. A light outlet face of the light panel system is preferably provided by the covering layer. The covering layer may provide a single, uninterrupted and contiguous light outlet face.

According to at least one embodiment, the covering layer is in direct contact with the light-emitting diodes at least in places. For example, the covering layer is applied directly to glass sheets of the individual light-emitting diodes serving as encapsulation. A refractive index of the covering layer differs from a component of the light-emitting diodes which is in contact with the covering layer preferably by at most 0.2 or by at most 0.1. In this way, efficient light outcoupling from the light-emitting diodes into the covering layer may be achieved.

According to at least one embodiment, the covering layer comprises one or more potting bodies or consists of one or more potting bodies. The light-emitting diodes are, for example, embedded in the potting body. The potting body is located in particular also at lateral boundary faces of the light-emitting diodes. The covering layer is formed from a one-piece potting body jointly surrounding all the light-emitting diodes.

According to at least one embodiment, the potting body comprises at least one admixture and/or at least one patterning for adjusting optical characteristics of the covering layer. For example, scattering particles are added to the potting body for improved light outcoupling. The potting body may likewise contain pigments for filtering radiation fractions, for example, ultraviolet radiation from the light-emitting diodes or from sunlight. In addition, colored pigments may be added to the potting body, in order to impart a specific color appearance when the light panel system is in the on and off states.

As an alternative or in addition to scattering particles, a micro-lens structure and/or surface roughening may be produced in the potting body by embossing. This allows improved light outcoupling and/or a directionalization of the emitted radiation. Customer-specific patterns may also be produced, likewise by embossing, which may be used as logos or icons for marketing purposes. The potting compound takes the form, for example, of a resin and/or a silicone.

According to at least one embodiment, the covering layer comprises at least one film (also referred to as foil) or consists of one or more films. As with the potting body, the film may contain an admixture and/or a patterning for adjusting optical characteristics of the covering layer. A film may also be combined with a potting body.

According to at least one embodiment, the light panel system comprises two or more than two electrical connection points. The electrical connection points are designed for electrical, external contacting of the light panel system. For example, the connection points are formed by a plug connection, for instance for a socket outlet.

According to at least one embodiment of the light panel system, at least some of the light-emitting diodes or all of the light-emitting diodes are electrically connected in series. It is alternatively possible for some of the light-emitting diodes or all of the light-emitting diodes to be connected electrically in parallel. However, a series connection is preferably present. It may be that light-emitting diodes are drivable individually or in groups.

According to at least one embodiment, the system carrier is a metallic carrier plate or the system carrier comprises a metallic carrier plate. For example, the carrier plate is a copper plate or an aluminum plate. A thickness of the carrier plate is, for example, at least 0.5 mm or at least 1 mm and/or at most 3 mm or at most 2 mm.

According to at least one embodiment, a wiring plane for electrical interconnection of the light-emitting diodes is located on the back of the system carrier opposite the carrier front. The wiring plane may be formed by cables, which connect adjacent light-emitting diodes, or indeed by patterning into conductor tracks of a layer located on the back. The wiring plane is, for example, connected by electrical through-vias with electrical terminals of the organic light-emitting diodes.

According to at least one embodiment, the system carrier comprises a carrier plate of an electrically insulating material or consists thereof. The carrier plate is then formed, for example, from a plastics material, a composite plastics material and/or a ceramic. It is possible for electrical conductor tracks for interconnection of the light-emitting diodes to be produced on the carrier plate or in the carrier plate.

According to at least one embodiment, the system carrier comprises a plurality of metallic planar elements. The planar elements are, for example, made from copper or aluminum. The planar elements may be formed both for electrical contacting of the light-emitting diodes and for cooling of the light-emitting diodes, i.e., as heat sinks.

According to at least one embodiment, the planar elements are located between the carrier plate and the light-emitting diodes. The light-emitting diodes are then fastened indirectly to the carrier plate via the planar elements.

According to at least one embodiment, two or more than two of the light-emitting diodes are assigned to each of the planar elements. Individual, peripheral planar elements or planar elements at the end and at the beginning of an electrical series connection are optionally assigned to precisely just one of the light-emitting diodes. The corresponding planar element and the assigned light-emitting diode may, when viewed in plan view onto the carrier front, overlap one another and cover one another at least in part. Electrical interconnection of the light-emitting diodes is then preferably brought about solely via the planar elements. At least two of the planar elements are preferably connected electrically directly with the drive electronics unit.

According to at least one embodiment, at least some of the planar elements are fork-shaped when viewed in plan view onto the carrier front. Fork-shaped may mean that the planar elements each have a base piece, corresponding to a handle of a fork, wherein two or more than two tines extend from the base piece. In comparison with the base piece, the tines preferably have a smaller width, for example, at most 25% of the width of the base piece.

According to at least one embodiment, the base piece projects from one of the planar elements in between the tines of a further one of the planar elements. The projecting base piece is preferably connected with an electrode of the assigned organic light-emitting diode and the tines of the further planar element are preferably connected with a further electrode of the assigned light-emitting diode.

According to at least one embodiment, a fill factor of the planar elements, when viewed in plan view and relative to an area of the carrier front, amounts to at least 70% or at least 80% or at least 90%. A spacing between adjacent planar elements, in a direction parallel to the carrier front, is, for example, at least 0.2 mm or at least 0.5 mm and/or at most 3 mm or at most 2.5 mm or at most 2 mm. The spacing in the lateral direction between adjacent planar elements is in particular dependent on the operating voltage with which the organic light-emitting diodes are operated.

According to at least one embodiment, the light-emitting diodes are mounted irreversibly and permanently on the system carrier. This may mean that, when used properly, the light-emitting diodes do not become detached from the system carrier. The light-emitting diodes then cannot, for example, be non-destructively detached from the system carrier. In this case, provision is not made for defective light-emitting diodes to be detachable from the system carrier and replaceable with functioning light-emitting diodes.

According to at least one embodiment, the light-emitting diodes are adhesively bonded or clipped onto the system carrier. The light-emitting diodes may likewise be soldered on, at points or over the entire surface. It is possible that the light-emitting diodes are, for example, pressed on, for instance via spring contacts or clip contacts, on the system carrier and that no further joining agent, such as an adhesive or a solder, is located between the light-emitting diodes and the system carrier.

According to at least one embodiment, the light-emitting diodes appear, when viewed in plan view onto the light panel system and outside of operation of the light panel system, to be diffusely reflective and not specular. It is possible that the light panel system may appear milky-opaque. The coloring of the light panel system in the region of the light-emitting diodes may be white. Using pigments, for instance in the covering layer, it is possible to bring about different coloration of the light panel system in the off state.

According to at least one embodiment, the light panel system comprises an arrangement of at least 2×2 or of at least 3×3 light-emitting diodes. Alternatively or in addition, the light-emitting diodes are arranged in a grid of at most 8×8 or 6×6. In contrast thereto, it is also possible for the light-emitting diodes to be arranged in a strip, i.e., in an arrangement of, for example, at least 1×2 and/or of at most 1×10.

According to at least one embodiment, a total thickness of the light panel system, in a direction perpendicular to the carrier front, is at least 3 mm or at least 4 mm or at least 5 mm. Alternatively or in addition, the total thickness amounts to at most 30 mm or at most 20 mm or at most 15 mm. Corresponding values may apply for the thickness of the light panel system, if the drive electronics unit is not taken into account in regard to thickness.

According to at least one embodiment, a lateral dimension of the light panel system, when viewed in plan view onto the carrier front, is at least 0.3 m×0.3 m or at least 0.3 m×0.5 m. Alternatively or in addition, the lateral dimension is at most 1.2 m×1.2 m or at most 0.9 m×0.9 m.

According to at least one embodiment, the light-emitting diodes have lateral dimensions of at least 0.1 m×0.1 m or of at least 0.18 m×0.18 m, when viewed in plan view onto the carrier front. The lateral dimensions may alternatively or additionally amount to at most 0.4 m×0.4 m or at most 0.35 m×0.35 m. Preferably, all the light-emitting diodes have the same outline, when viewed in plan view onto the carrier front. In contrast thereto, the light panel system may contain light-emitting diodes with different outlines, when viewed in plan view.

According to at least one embodiment, a luminance averaged over the light panel system, when used properly, is at least 2500 $cd/m^2$ or at least 3000 $cd/m^2$ or at least 3800 $cd/m^2$. To this end, organic light-emitting diodes may be used which each comprise a plurality of organic active layers provided for generating radiation.

According to at least one embodiment, facets are arranged downstream of the light-emitting diodes in a main emission direction, in particular perpendicular to the carrier front. The facets are designed for glare suppression. The facets, when viewed in plan view, may be box-shaped or lattice-shaped. The facets are, for example, reflective plates, which are oriented transversely of, in particular perpendicular to the carrier front.

According to at least one embodiment, the facets, when viewed in plan view onto the carrier front and preferably within the bounds of manufacturing tolerances, extend congruently with borders or outer edges of the individual light-emitting diodes. A grid arrangement of the light-emitting diodes may thus correspond to a grid arrangement of the facets.

BRIEF DESCRIPTION OF THE DRAWINGS

A light panel system described here will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

In the drawings:

FIGS. 1A, 1B, 2, 3A, 3B, 3C, 3D, 3E, 4A, 4B, 4C, 5A, 5B, 5C, 6A, 6B, and 6C show schematic representations of exemplary embodiments of light panel systems described here.

DETAILED DESCRIPTION OF ILLUSTRATIVE EMBODIMENTS

Figure 1A:
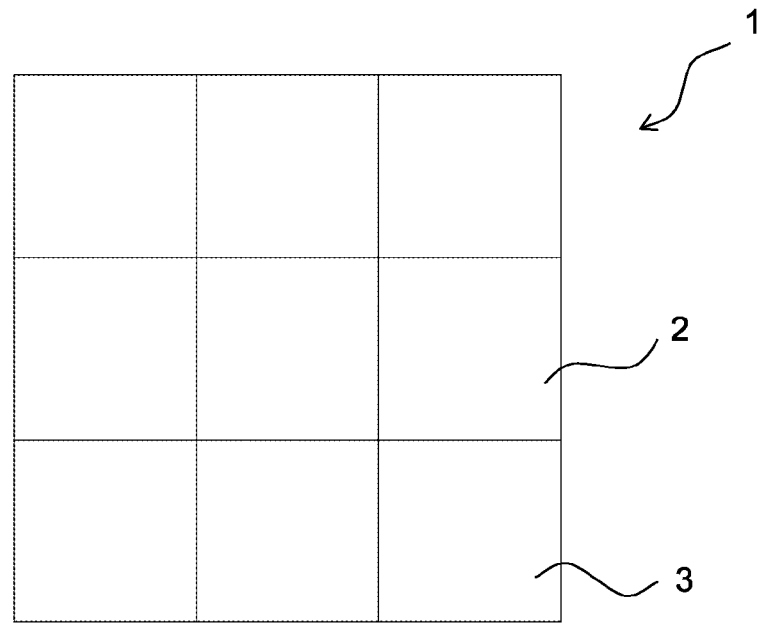
Figure 1B:
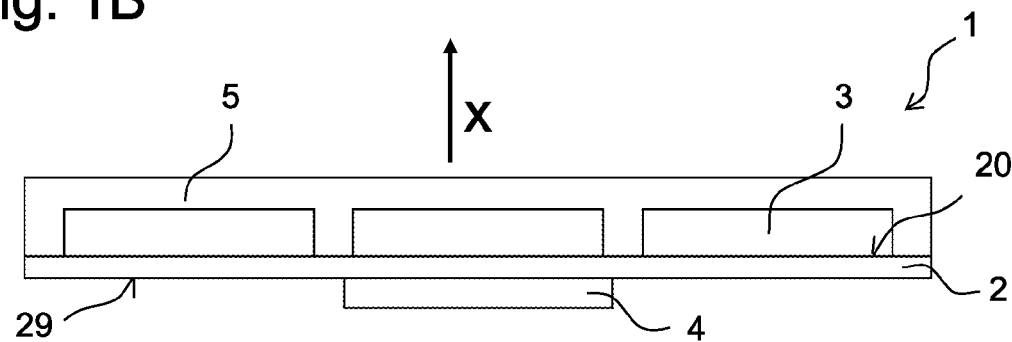

FIG. 1A is a schematic plan view and FIG. 1B a schematic sectional representation of one exemplary embodiment of a light panel system 1.

The light panel system 1 comprises a system carrier 2. The system carrier 2 is, for example, formed of a metal carrier and/or of a plastics carrier, on which electrical conductor tracks are formed. To simplify the illustration, the electrical conductor tracks are not shown in FIGS. 1A and 1B.

A plurality of organic light-emitting diodes 3 are mounted on a carrier front 20, according to FIG. 1A in a 3×3 grid. The external dimensions of the organic light-emitting diodes 3 amount, for example, to 118 mm×118 mm, 197 mm×197 mm or 297 mm×297 mm, corresponding to a grid dimension of 120 mm, 200 mm or 300 mm. Unlike in the illustration, linear arrangements with two, three, four or indeed ten light-emitting diodes 3 may also be produced or arrangement grids of, for example, 5×5 or 2×2 or 2×4 or 3×6 of the light-emitting diodes 3. Preferably the light panel system 1 has a resultant area dimension which is standardized. The resultant area dimension amounts, for example, to 600 mm×600 mm. A main emission direction x of the light-emitting diodes 3 and of the light panel system 1 is preferably oriented perpendicularly to the carrier front 20.

On a back 29 of the system carrier 2 there is located a drive electronics unit 4. The drive electronics unit 4 is, for example, an electronic ballast. Unlike in the illustration, the drive electronics unit 4, as indeed in all the other exemplary embodiments, may take the form of a "Molded Interconnect Device." The ballast may be provided with polarity reversal protection.

On the input side the drive electronics unit 4 is, for example, designed for an AC voltage in the range from 100 V to 240 V. The drive electronics unit 4 may generate a direct current, which comprises a voltage adapted to the circuit of the light-emitting diodes 3. A voltage of around 7 V or 11 V is, for example, provided for each organic light-emitting diode 3, depending on the number of active layers in the organic light-emitting diodes 3. The current made available for the organic light-emitting diodes 3 is, for example, at least 0.1 A and/or at most 1.5 A, depending on the surface area of the organic light-emitting diodes 3 when viewed in plan view. Depending on the number of organic light-emitting diodes 3, the voltage provided by the drive electronics unit 4 is, for example, at least 25 V or at least 60 V and/or at most 300 V or at most 120 V.

The conductor tracks, not shown, for electrical supply of the organic light-emitting diodes 3 require appropriate adaptation to the voltage values and to the current values. Alternating current is preferably transformed into direct current centrally in the drive electronics unit 4. The individual organic light-emitting diodes 3 are preferably free of any extra electronics such as DC/DC converters.

Optionally, as also in all the other exemplary embodiments, the light panel system 1 comprises a covering layer 5. The covering layer 5 is provided, for example, by a potting compound and/or by a film. The covering layer 5 is in places in direct contact with the light-emitting diodes 3. An interspace between adjacent light-emitting diodes 3 may be filled by the covering layer 5. The covering layer 5 may partially or completely cover lateral boundary faces of the light-emitting diodes 3.

The covering layer 5 preferably comprises at least one admixture and/or a patterning, not shown, for instance for improving light outcoupling efficiency or to protect against ultraviolet radiation. Appropriate patterning, such as micro-optical elements, may serve as glare suppression measures in a general lighting application, for example, for lighting offices.

Figure 2:
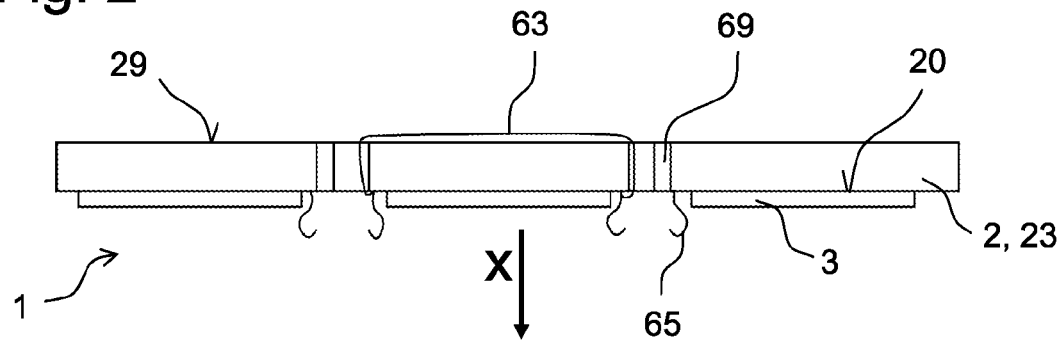

FIG. 2 is a schematic sectional representation of a further exemplary embodiment of the light panel system 1. The system carrier 2 comprises a carrier plate 23. The carrier plate 23 is made from a metal and preferably coated with an electrically insulating layer, for instance a lacquer, which is not shown. On a side facing the organic light-emitting diodes 3 a thermal contact layer, for example, in the form of a graphite film, may be mounted on the carrier plate 23.

The organic light-emitting diodes 3 are fastened to the system carrier 2 using fastening clips 65 of clip contacts or of spring contacts. There is no further connecting means between the light-emitting diodes 3 and the carrier plate 23.

Through-vias 69 have been formed in the carrier plate 23. The fastening clips 65 may be connected to one another through the through-vias 69 via a wiring system 63. The wiring system 63 is shown only in a highly simplified manner in FIG. 2, and the drive electronics unit 4 is not shown in FIG. 2. As an alternative to the wiring system 63, conductor tracks may be formed on the system carrier 2. Unlike in the drawing, it is possible for the fastening clips 65 not to project beyond a side of the light-emitting diodes 3 remote from the carrier 2 or beyond the covering layer 5, not shown.

Figure 3A:
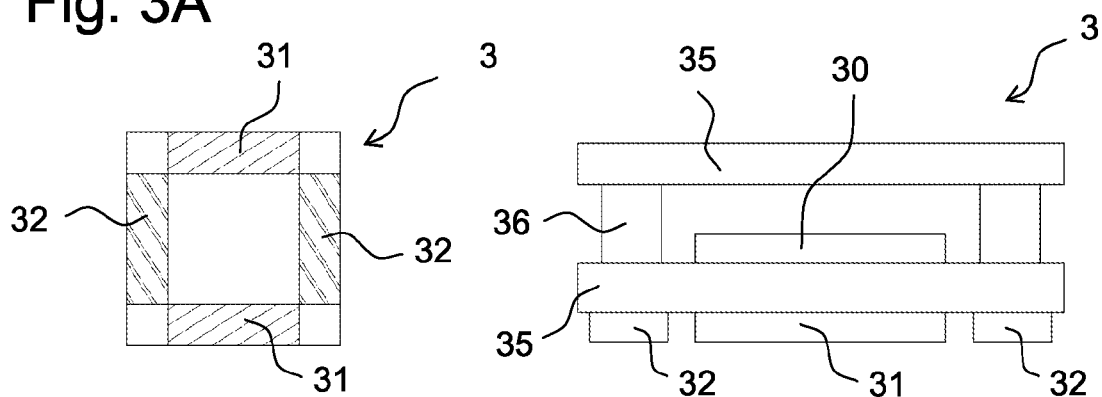

FIG. 3A shows schematically on the left a schematic view from below and on the right a schematic sectional representation of an organic light-emitting diode 3 for light panel systems 1 described here. The light-emitting diode 3 comprises two carriers 35, between which is mounted an organic layer sequence with a radiation-generating active layer 30. The two carriers 35 are connected together via an encapsulation 36. On one of the carriers 35 are located electrodes 31, 32. An emitting side of the light-emitting diode 3 is preferably opposite the electrodes 31, 32. The electrodes 31, 32 are mounted in strips at edges of one of the carriers 35.

The light-emitting diode 3 is shown in each case with a square outline. Unlike here, as also in all the other exemplary embodiments, light-emitting diodes 3 with other geometries may also be used. The electrodes 31, 32 on the carrier 35 may also be configured differently from the illustration according to FIG. 3A. A thickness of the light-emitting diodes 3 is, for example, at least 1.5 mm or at least 2.5 mm and/or at most 5 mm or at most 4 mm.

Figure 3B:
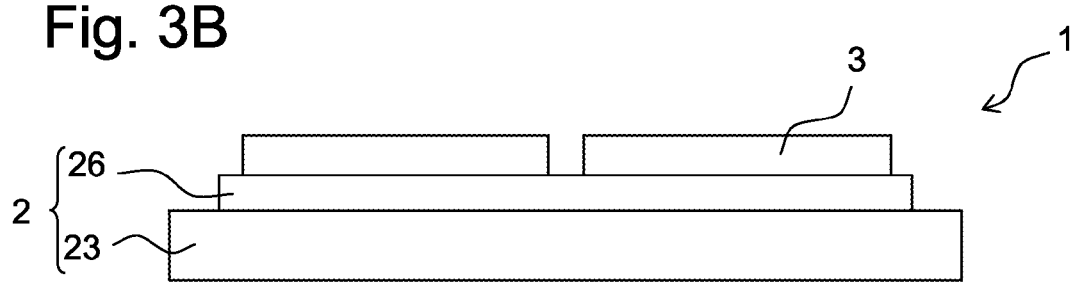
Figure 3C:
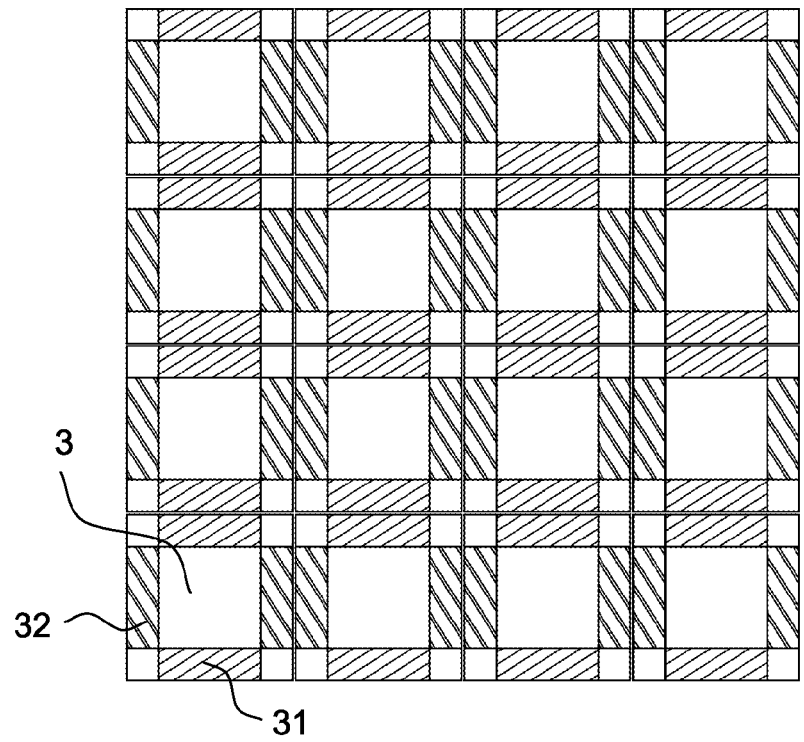
Figure 3D:
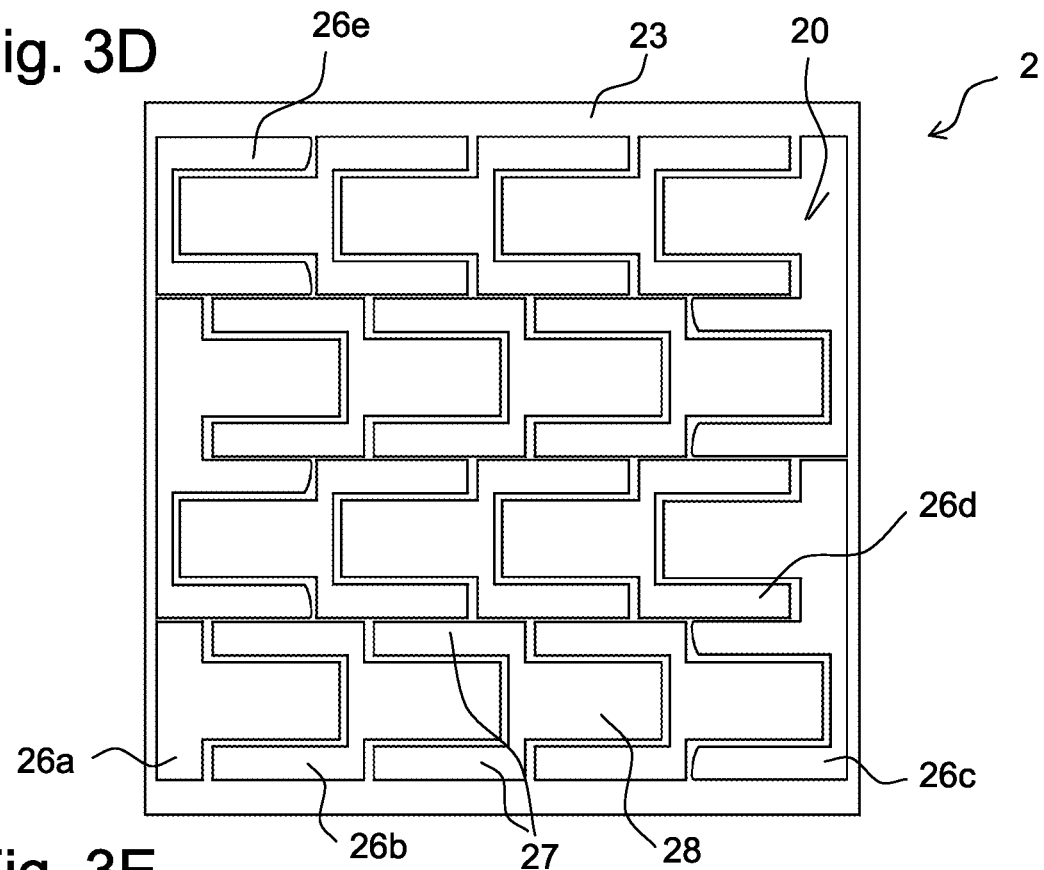
Figure 3E:
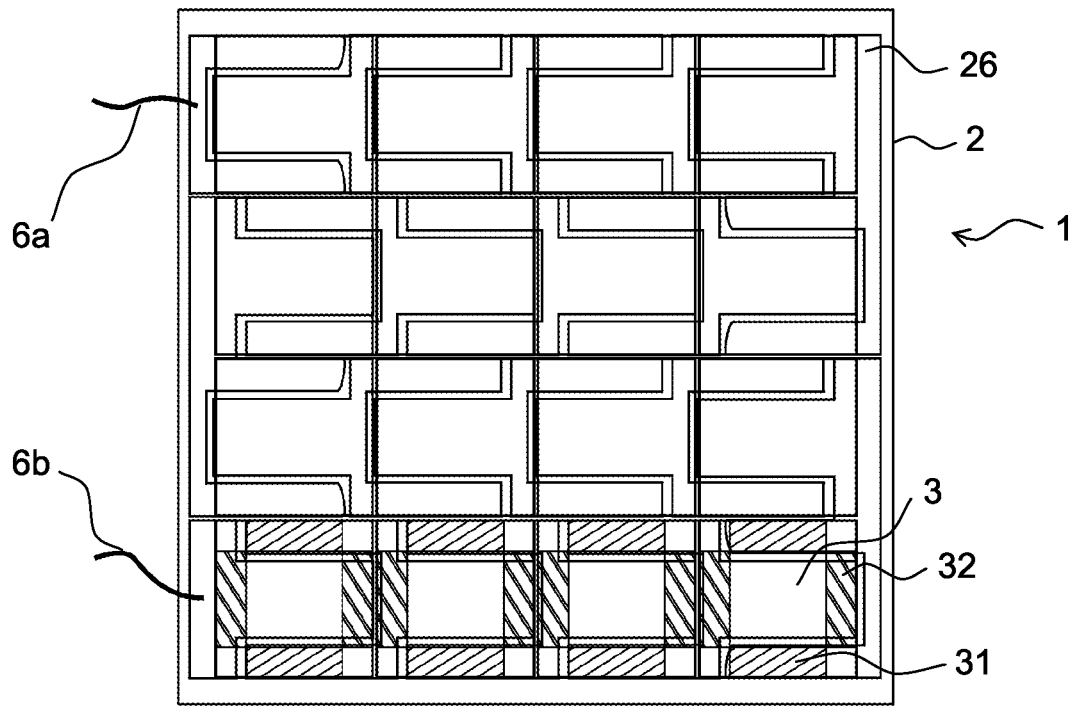

FIG. 3B shows a schematic sectional representation of a further exemplary embodiment of the light panel system 1. FIG. 3C shows an arrangement of the light-emitting diodes 3 and FIG. 3D shows the system carrier 2 in a plan view onto the carrier front 20. In FIG. 3E the system carrier 2 is illustrated schematically together with the light-emitting diodes 3.

The system carrier 2 comprises the carrier plate 23 and a plurality of planar elements 26. The carrier plate 23 is, for example, formed from a plastics material or a composite plastics material. A thickness of the carrier plate 23 is here, for example, at least 2 mm or at least 3 mm and/or at most 5 mm or at most 4 mm. Between the light-emitting diodes 3 and the carrier plate 23 are located the planar elements 26, which are made from a metal or a ceramic. Apart from peripheral planar elements 26a, 26e, precisely two of the light-emitting diodes 3 are assigned electrically and spatially to each of the planar elements 26b, 26c, 26d, see FIG. 3E. The light-emitting diodes 3 are all identically oriented.

Via the planar elements 26, the light-emitting diodes 3 are connected electrically in series. Central planar elements 26b, 26d each have a base piece 28 and tines 27. These planar elements 26b, 26d are shaped like tuning forks, when viewed in plan view onto the carrier front 20. Via the peripheral planar elements 26c, adjacent rows are connected together electrically. The central planar elements 26b, 26d in adjacent rows are oriented antiparallel to one another and otherwise are identical in shape when viewed in plan view.

The two first electrodes 31, see FIGS. 3C and 3D, come in each case to lie on the tines 27. The two second electrodes 32 are in each case connected electrically with the base pieces 28. By shaping the planar elements 26 appropriately, a virtually space-filling arrangement of the planar elements 26 on the carrier front 20 is achievable. The planar elements 26 serve in thermal and electrical contacting of the light-emitting diodes 3.

Electrical connection points 6 are formed at the first and last planar elements 26a, 26e of the series connection, via which connection points the light panel system 1 is electrically externally contactable.

As also in all the other exemplary embodiments, unlike in the illustration according to FIGS. 3A to 3E wiring of the light-emitting diodes 3 other than as an electrical series connection may be achieved. The planar elements 26 according to FIGS. 3A to 3E or the wiring system 63 according to FIG. 2 may be adapted accordingly.

Figure 4A:
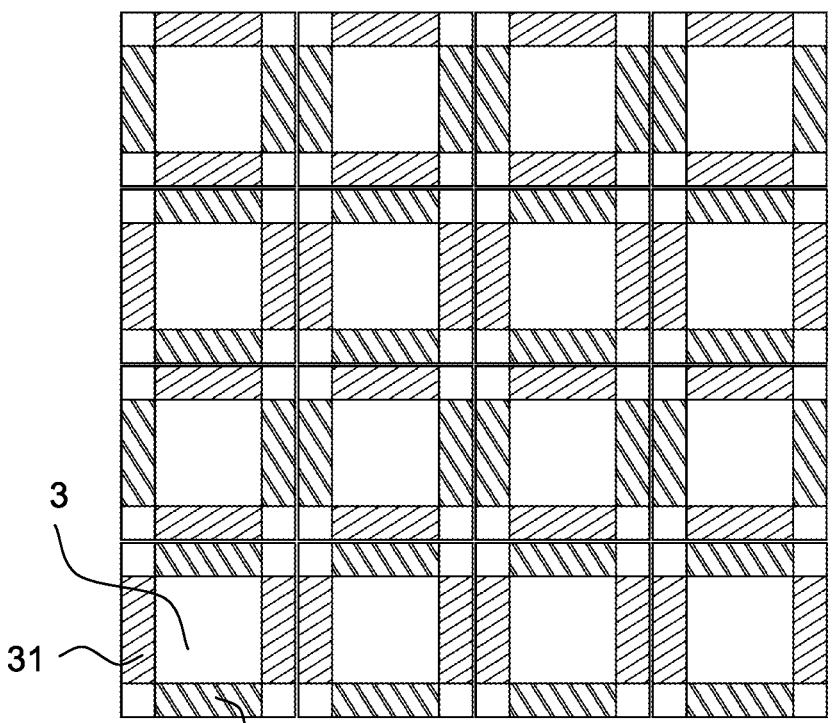
Figure 4B:
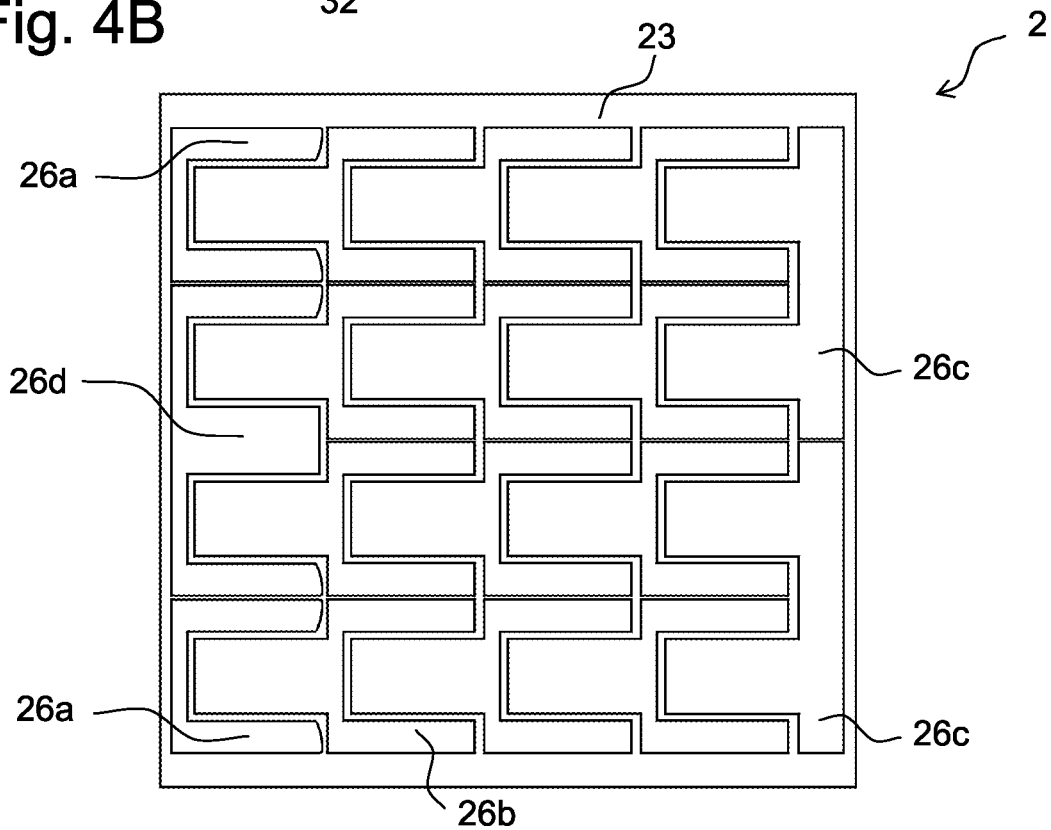
Figure 4C:
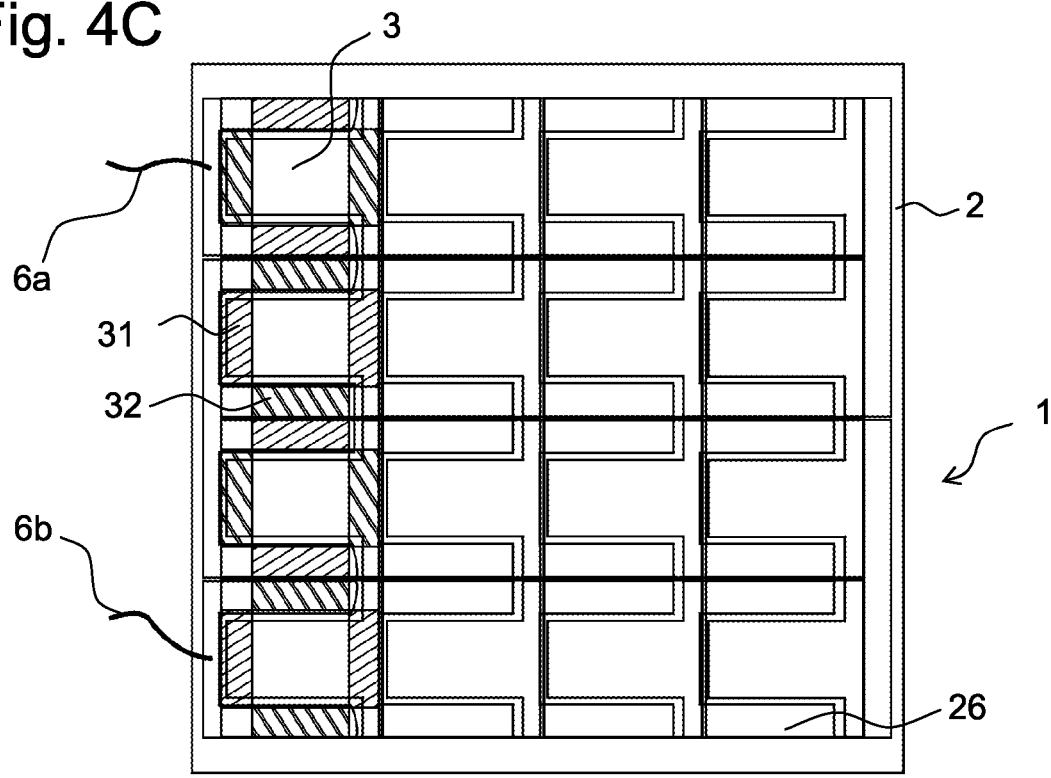

FIGS. 4A, 4B and 4C show a further exemplary embodiment of the light panel system 1, in a manner similar to the illustrations according to FIGS. 3C, 3D and 3E.

The planar elements 26b in adjacent rows are oriented parallel to one another according to FIG. 4B. The orientation of the light-emitting diodes 3 changes between adjacent rows.

Figure 5A:
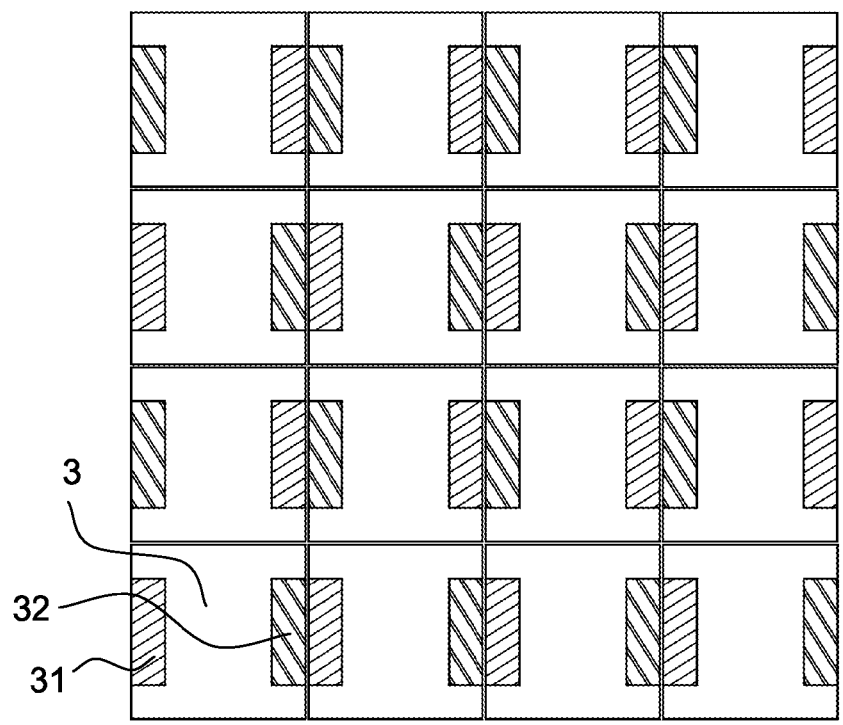

A further exemplary embodiment of the light panel system 1 is shown in FIGS. 5A to 5C, in a manner similar to the illustrations according to FIGS. 4A to 4C. The light-emitting diodes 3, see FIG. 5A, each comprise just one first electrode 31 and one second electrode 32. In this way, a configuration of the planar elements 26, see FIG. 5B, can be simplified.

The central planar elements 26b each have the same outline as the light-emitting diodes 3. The planar elements 26b extend over two of the light-emitting diodes 3. In comparison with the arrangements according to FIGS. 3A to 4C, geometrically simpler planar elements 26 may be used. However, through the in each case two first and second electrodes 31, 32 in the exemplary embodiments according to FIGS. 3A to 4C, more homogeneous current feed to the light-emitting diodes 3 may be achieved and thus a more homogeneous luminance distribution over the light-emitting surface.

Unlike as is indicated in connection with FIGS. 1A to 5C, it is not absolutely essential for the organic light-emitting diodes 3 to take the form of individual components. Likewise, organic light-emitting diodes 3 may be used which, when unsingulated, may be used in particular with a "mother glass". Corresponding, mechanically contiguous light-emitting diodes 3 may be wired electrically independently of one another, in a manner similar to the illustration according to FIG. 3A. Alternatively, such contiguous light-emitting diodes 3 may be electrically interconnected as early as by means of conductor track patterns on the mother glass. A wiring plane on the system carrier 2 may then be omitted. From the standpoint of production yield, such a mother glass batch of mechanically contiguous light-emitting diodes 3 is not preferred, however, despite the greater simplicity of mounting the individual light-emitting diodes 3 on the system carrier 2.

Figure 6A:
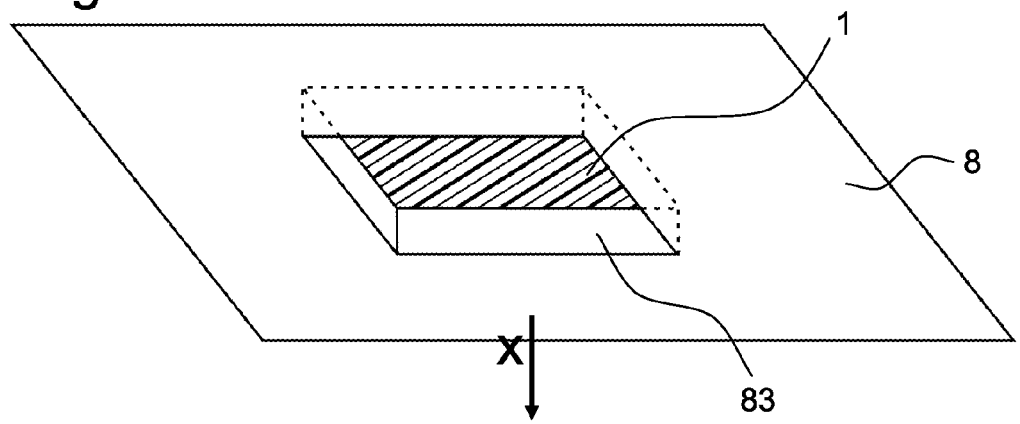
Figure 6B:
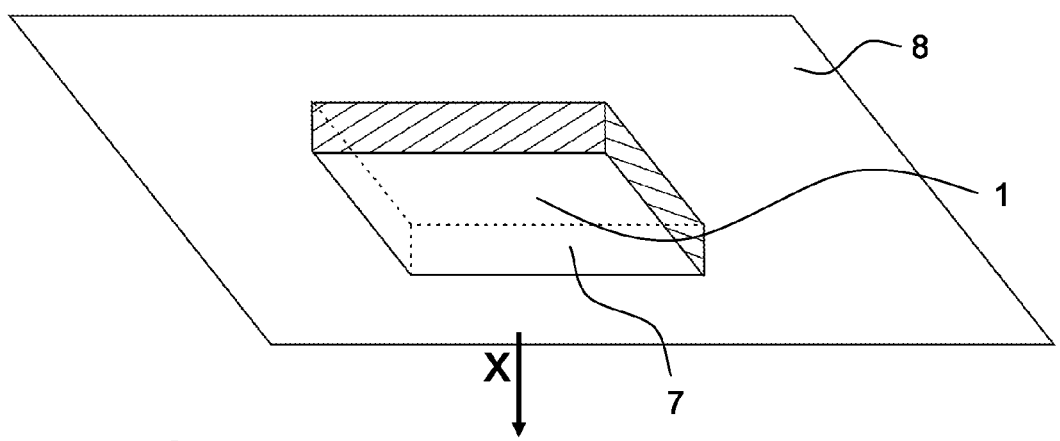
Figure 6C:
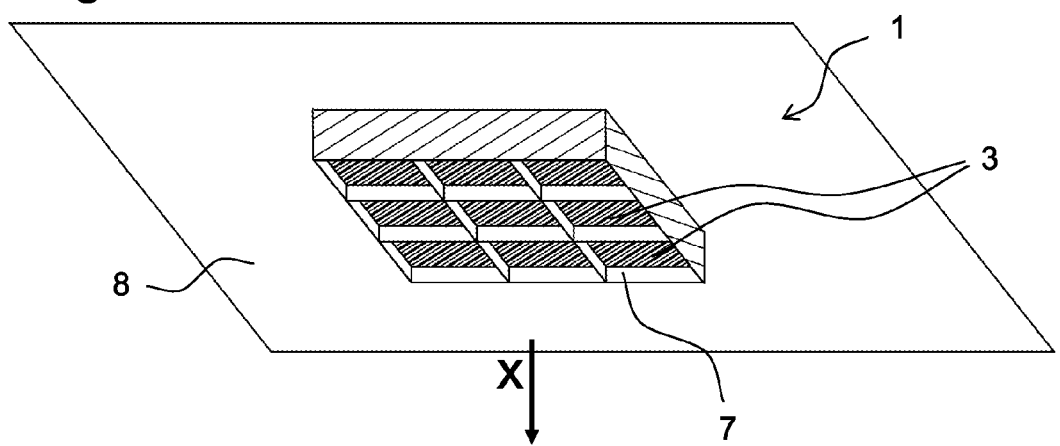

FIGS. 6A to 6C shows further exemplary embodiments of the light panel systems 1 and mounting options for the light panel systems 1, in each case in perspective representations.

According to FIG. 6A, the light panel system 1 is sunk in a well 83 in an installation surface 8. The installation surface 8 comprises, for example, a ceiling or indeed a wall or a floor. The well 83 enables the achievement of glare suppression, in particular if a covering layer, not shown in FIGS. 6A to 6C, lacks any micro-optical elements for glare suppression.

According to FIG. 6B, the light panel system 1 is surrounded in the manner of a frame by a facet 7 which succeeds the light panel system 1 in the main emission direction x.

In the exemplary embodiment according to FIG. 6C, the light panel system 1 comprises a 3×3 arrangement of the organic light-emitting diodes 3. The facets 7 extend congruently to edges between the light-emitting diodes 3. In addition, the facets 7, when viewed in plan view, peripherally surround the entire light panel system 1.

The facets 7 or also inner sides of the well 83 may be configured to be specularly or diffusely reflecting. It is possible for the facets 7 to be integrated mechanically fixedly in the light panel system 1 or indeed for the facets 7 to be separate components independent of the light panel system 1.

The extent of the facets 7 in the main emission direction x is dependent on the spacing of adjacent facets 7 relative to one another. The greater is this distance, the greater is generally the extent of the facets 7 in the main emission direction x.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A light panel system comprising:
a system carrier with a carrier front;
a plurality of organic light-emitting diodes arranged in a regular grid on the carrier front;
planar elements located between the system carrier and the light-emitting diodes;
a covering layer partially or completely covering lateral boundary faces of the light-emitting diodes and providing a single, uninterrupted and contiguous light outlet face of the light panel system; and
a drive electronics unit mounted on or in the system carrier, wherein the light panel system is configured to be handled and mounted as a single unit,
where in the organic light-emitting diodes are individual components that are individually electrically drivable,
wherein the organic light-emitting diodes are adhesively bonded, soldered or clipped onto the system carrier,
wherein at least some of the planar elements are fork shaped in plan view providing an electrical series connection,
wherein each planar element has a base piece and two or more tines extending from the base piece, the tines having a smaller width than the base piece,
wherein each base piece projects from a respective planar element in between tines of a further planar element, and
wherein the projecting base piece with an electrode of an assigned organic light emitting diode and the tines of the further planar element are connected with a further electrode of the assigned light emitting diode.

2. The light panel system according to claim 1, wherein the covering layer comprises a potting body jointly surrounding the light-emitting diodes, wherein the potting body contains the admixture or the patterning for adjusting optical characteristics of the covering layer.

3. The light panel system according to claim 1, further comprising precisely two electrical connection points for external electrical contacting, and wherein all the light-emitting diodes are electrically connected in series.

4. The light panel system according to claim 1, wherein the system carrier comprises a metallic carrier plate, and wherein a wiring plane for electrical interconnection of the light-emitting diodes is located on a back of the system carrier opposite the carrier front.

5. The light panel system according to claim 1, wherein the system carrier comprises a carrier plate of an electrically insulating material, and wherein metallic planar elements are located between the carrier plate and the light-emitting diodes.

6. The light panel system according to claim 1, wherein the light-emitting diodes are mounted irreversibly and permanently on the system carrier, such that, when used properly, the light-emitting diodes do not become detached from the system carrier.

7. The light panel system according to claim 1, wherein, when viewed in plan view onto the light-emitting diodes, the light panel system appears diffusely reflective, milky-opaque or white.

8. The light panel system according to claim 1, wherein the light panel system comprises between 2×2 and 8×8, inclusive, of the light-emitting diodes.

9. The light panel system according to claim 1, wherein:
a total thickness of the light panel system is between 4 mm and 20 mm, inclusive;
lateral dimensions of the light panel system are at least 0.3 m×0.3 m;
lateral dimensions of the light-emitting diodes are between 0.1 m×0.1 m and 0.4 m×0.4 m inclusive; and
a luminance averaged over the light panel system, when used properly, amounts to at least 3000 $cd/m^2$.

10. The light panel system according to claim 1, wherein facets are arranged downstream of the light-emitting diodes in a main emission direction for glare suppression and wherein the facets, when viewed in plan view onto the carrier front, extend congruently with edges of the individual light-emitting diodes.

11. The light panel system according to claim 1, wherein the covering layer comprises a foil that contains an admixture for adjusting optical characteristics of the covering layer.

12. The light panel system according to claim 1, wherein the covering layer comprises a foil that contains a patterning for adjusting optical characteristics of the covering layer.

13. The light panel system according to claim 1, wherein the organic light-emitting diodes are clipped onto the system carrier.

14. The light panel system according to claim 5, wherein two of the light-emitting diodes are assigned to each of the planar elements, when viewed in plan view onto the carrier front, and wherein the light-emitting diodes are electrically interconnected by the planar elements and the planar elements are configured to dissipate heat from the light-emitting diodes.

15. The light panel system according to claim 5, wherein a fill factor of the planar elements, when viewed in plan view and relative to the carrier front, is at least 80%.

\* \* \* \* \*